United States Patent
Yamaguchi

(10) Patent No.: US 12,512,438 B2
(45) Date of Patent: Dec. 30, 2025

(54) SEMICONDUCTOR DEVICE AND METHOD FOR MANUFACTURING THE SAME

(71) Applicant: Mitsubishi Electric Corporation, Tokyo (JP)

(72) Inventor: Hideki Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 464 days.

(21) Appl. No.: 18/066,195

(22) Filed: Dec. 14, 2022

(65) Prior Publication Data

US 2023/0260952 A1   Aug. 17, 2023

(30) Foreign Application Priority Data

Feb. 15, 2022 (JP) ................. 2022-021480

(51) Int. Cl.
 *H01L 23/00* (2006.01)
 *H01L 23/495* (2006.01)
 *H01L 25/07* (2006.01)

(52) U.S. Cl.
 CPC ........ *H01L 24/49* (2013.01); *H01L 23/49537* (2013.01); *H01L 23/49575* (2013.01); *H01L 24/48* (2013.01); *H01L 24/85* (2013.01); *H01L 25/072* (2013.01); *H01L 24/32* (2013.01); *H01L 24/73* (2013.01); *H01L 2224/32245* (2013.01); *H01L 2224/48011* (2013.01);
 (Continued)

(58) Field of Classification Search
 CPC ....................... H01L 23/4952; H01L 23/49575
 See application file for complete search history.

(56) References Cited

U.S. PATENT DOCUMENTS

2004/0164128 A1   8/2004 Mii
2017/0294369 A1*  10/2017 Kawashima ...... H01L 23/49558
(Continued)

FOREIGN PATENT DOCUMENTS

| JP | 2004-247672 A | 9/2004 |
| JP | 2007-294530 A | 11/2007 |
| JP | 2008-263210 A | 10/2008 |

OTHER PUBLICATIONS

"Notice of Reasons for Refusal" Office Action issued in JP 2022-021480; mailed by the Japanese Patent Office on Jan. 7, 2025.

*Primary Examiner* — Yu-Hsi D Sun
(74) *Attorney, Agent, or Firm* — Studebaker Brackett PLLC

(57) ABSTRACT

A semiconductor device capable of securing an insulation distance between a semiconductor element and a wiring. The semiconductor device includes a first semiconductor element, a second semiconductor element, a first wiring, and a second wiring. The first semiconductor element includes a first main surface and a second main surface. An electrode is formed on the first main surface. The second semiconductor element is disposed at a position different from a position of the first semiconductor element in a thickness direction. The first wiring includes an end connected to the electrode. The end includes an upper surface and a cut surface. Diameter of the second wiring is smaller than diameter of the first wiring. The second wiring includes a first end and a second end. The first end is directly connected to the upper surface of the end of the first wiring.

10 Claims, 5 Drawing Sheets

(52) U.S. Cl.
CPC ............... *H01L 2224/48091* (2013.01); *H01L 2224/48096* (2013.01); *H01L 2224/48101* (2013.01); *H01L 2224/48106* (2013.01); *H01L 2224/48111* (2013.01); *H01L 2224/48139* (2013.01); *H01L 2224/48245* (2013.01); *H01L 2224/48465* (2013.01); *H01L 2224/4903* (2013.01); *H01L 2224/49052* (2013.01); *H01L 2224/49112* (2013.01); *H01L 2224/73265* (2013.01); *H01L 2224/85205* (2013.01); *H01L 2224/85345* (2013.01); *H01L 2924/10253* (2013.01); *H01L 2924/10272* (2013.01); *H01L 2924/12032* (2013.01); *H01L 2924/13055* (2013.01); *H01L 2924/13091* (2013.01)

(56) References Cited

U.S. PATENT DOCUMENTS

2021/0375727 A1\* 12/2021 Kawahara ......... H01L 23/49551
2024/0128169 A1\* 4/2024 Okuda ................ H01L 23/3107

\* cited by examiner

SEMICONDUCTOR DEVICE AND METHOD FOR MANUFACTURING THE SAME

BACKGROUND OF THE INVENTION

Field of the Invention

The present disclosure relates to a semiconductor device and a method for manufacturing the same.

Description of the Background Art

Conventionally, there has been known a semiconductor device in which a base (bump) is formed on an electrode of a semiconductor element for the purpose of, for example, securing an insulation distance between the semiconductor element and a wiring bonded to the electrode of the semiconductor element and the wiring is bonded onto the base (for example, see Japanese Patent Laying-Open No. 2004-247672). Japanese Patent Laying-Open No. 2004-247672 discloses a semiconductor device in which a multistage bump as a base is formed by bonding metal wiring on an electrode of a semiconductor element a plurality of times and the wiring is connected on the multistage bump.

SUMMARY OF THE INVENTION

In the above-described semiconductor device, in order to form the base connecting the wiring on the electrode, a bonding operation is performed a plurality of times on the electrode of the semiconductor element. In this case, because impact due to the bonding operation is applied to the semiconductor element a plurality of times, there is a possibility that the semiconductor element is damaged.

Therefore, an object of the present disclosure is to provide a semiconductor device capable of securing an insulation distance between the semiconductor element and the wiring while preventing damage to the semiconductor element.

A semiconductor device according to the present disclosure includes a first semiconductor element, a second semiconductor element, a first wiring, and a second wiring. The first semiconductor element includes a first main surface and a second main surface. The second main surface is located on a side opposite to the first main surface. An electrode is formed on the first main surface. The second semiconductor element is disposed at a position different from a position of the first semiconductor element in a thickness direction from the first main surface toward the second main surface. The first wiring is connected to the electrode. The first wiring includes an end connected to the electrode. The end includes an upper surface and a cut surface. The cut surface is located in a direction different from the upper surface. The second wiring electrically connects the first semiconductor element and the second semiconductor element. A diameter of the second wiring is smaller than a diameter of the first wiring. The second wiring includes a first end and a second end. The second end is located on a side opposite to the first end. The first end is directly connected to the upper surface at the end of the first wiring. The second end is connected to the second semiconductor element.

A semiconductor device according to the present disclosure includes a first semiconductor element, a second semiconductor element, a first wiring, and a second wiring. The first semiconductor element includes a first main surface and a second main surface. The second main surface is located on a side opposite to the first main surface. An electrode is formed on the first main surface. The second semiconductor element is disposed at a position different from a position of the first semiconductor element in a thickness direction from the first main surface toward the second main surface. The first wiring is connected to the electrode. The first wiring has a ribbon shape and includes an end connected to the electrode. The end includes an upper surface. The second wiring electrically connects the first semiconductor element and the second semiconductor element. A diameter of the second wiring is smaller than a width of the first wiring in a direction intersecting with an extending direction of the first wiring. The second wiring includes a first end and a second end. The second end is located on a side opposite to the first end. The first end is directly connected to the upper surface at the end of the first wiring. The second end is connected to the second semiconductor element.

A method for manufacturing a semiconductor device according to the present disclosure includes preparing a first semiconductor element and a second semiconductor element. The first semiconductor element includes a first main surface and a second main surface. The second main surface is located on a side opposite to the first main surface. An electrode is formed on the first main surface. The second semiconductor element is disposed at a position different from a position of the first semiconductor element in a thickness direction from the first main surface toward the second main surface. The method for manufacturing the semiconductor device further includes connecting an end of a first wiring to the electrode, and electrically connecting the first semiconductor element and the second semiconductor element by a second wiring. The end includes an upper surface and a cut surface. The cut surface is located in a direction different from the upper surface. A diameter of the second wiring is smaller than a diameter of the first wiring. The second wiring includes a first end and a second end. The second end is located on a side opposite to the first end. In the electrically connecting the first semiconductor element and the second semiconductor element by the second wiring, the first end is directly connected to an upper surface at the end of the first wiring. The second end is connected to the second semiconductor element.

A method for manufacturing a semiconductor device according to the present disclosure includes preparing a first semiconductor element and a second semiconductor element. The first semiconductor element includes a first main surface and a second main surface. The second main surface is located on a side opposite to the first main surface. An electrode is formed on the first main surface. The second semiconductor element is disposed at a position different from a position of the first semiconductor element in a thickness direction from the first main surface toward the second main surface. The method for manufacturing the semiconductor device further includes connecting an end of a first wiring to the electrode, and electrically connecting the first semiconductor element and the second semiconductor element by a second wiring. The first wiring has a ribbon shape. The end includes an upper surface. A diameter of the second wiring is smaller than a width of the first wiring in a direction intersecting with an extending direction of the first wiring. The second wiring includes a first end and a second end. The second end is located on a side opposite to the first end. In the electrically connecting the first semiconductor element and the second semiconductor element by the second wiring, the first end is directly connected to an upper surface at the end of the first wiring. The second end is connected to the second semiconductor element.

The foregoing and other objects, features, aspects and advantages of the present disclosure will become more

DESCRIPTION OF THE PREFERRED EMBODIMENTS

Figure 1:
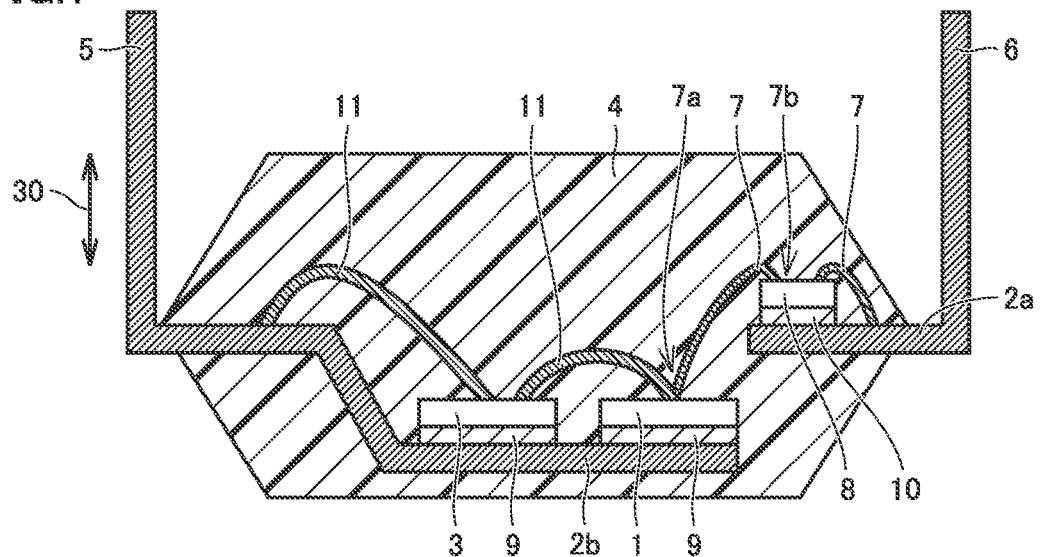
FIG. 1 is a schematic sectional view illustrating a semiconductor device according to a first embodiment.

Hereinafter, embodiments of the present disclosure will be described. The same components are denoted by the same reference numerals, and a repetitive description will be omitted.

First Embodiment

<Configuration of Semiconductor Device>

Figure 2:
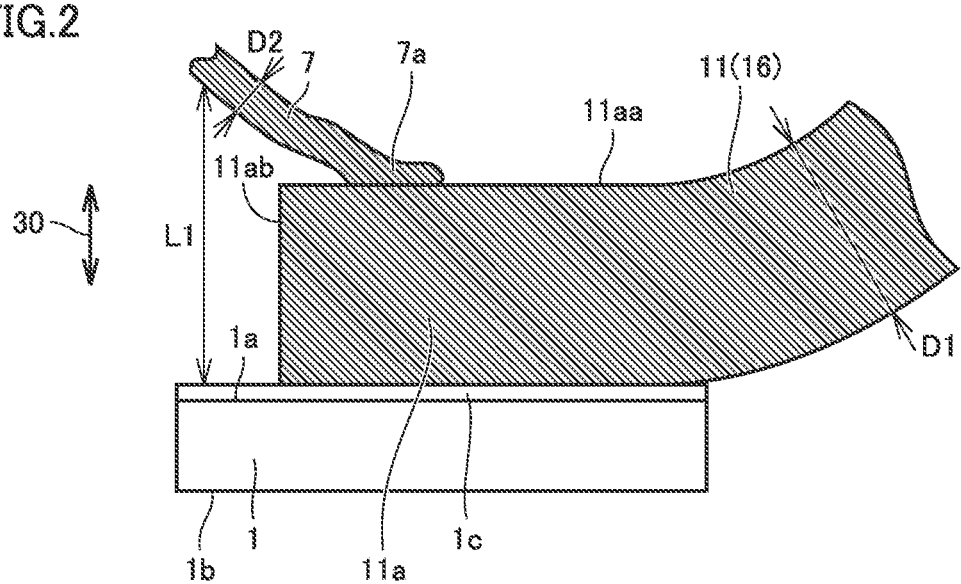
FIG. 2 is a schematic partially sectional view of the semiconductor device illustrated in FIG. 1.
Figure 3:
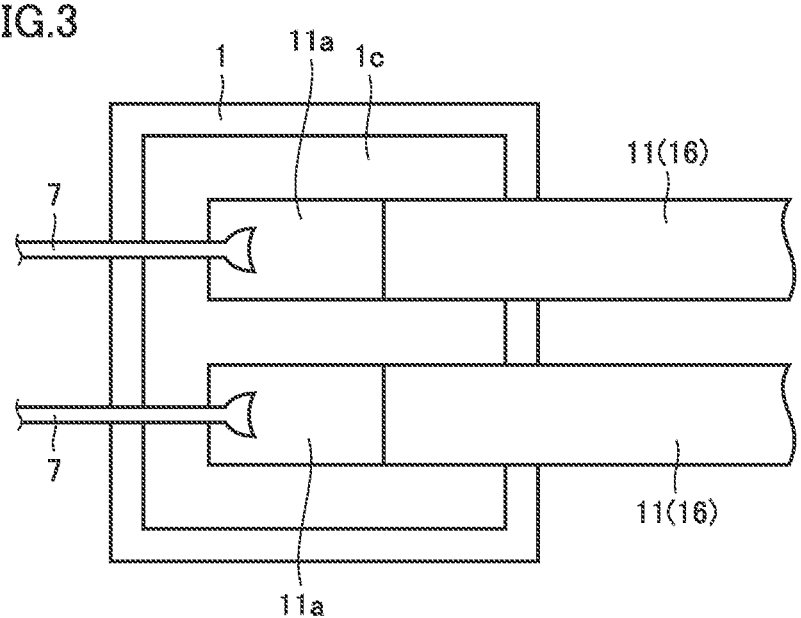
FIG. 3 is a schematic partially plan view of the semiconductor device illustrated in FIG. 1.

FIG. 1 is a schematic sectional view illustrating a semiconductor device according to a first embodiment. FIG. 2 is a schematic partially sectional view of the semiconductor device illustrated in FIG. 1. FIG. 3 is a schematic partially plan view of the semiconductor device illustrated in FIG. 1. FIG. 2 is a sectional view taken along a section passing through a second wiring 7 and a first wiring 11 of a part in FIG. 3.

The semiconductor device according to the present disclosure mainly includes lead frames 2a, 2b, a first semiconductor element 1, a second semiconductor element 8, a third semiconductor element 3, first wiring 11, second wiring 7, and a molding resin 4.

Lead frame 2a is disposed away from an upper surface of lead frame 2b. An IC terminal 6 is formed at an end of lead frame 2a. A power terminal 5 is formed at an end of lead frame 2b. IC terminal 6 and power terminal 5 are terminals electrically connecting the semiconductor device to an outside. For example, lead frames 2a, 2b are made of copper or a copper alloy. Lead frames 2a, 2b have steps formed by bending. Lead frame 2a is disposed at a height position of a frame (not illustrated). Thicknesses of lead frames 2a, 2b are set according to values of current flowing through IC terminal 6 and power terminal 5 when the semiconductor device is actually used in order to stably manufacture lead frames 2a, 2b by press working. For example, the thicknesses of lead frames 2a, 2b are greater than or equal to 0.1 mm and less than or equal to 1 mm.

Second semiconductor element 8 is connected to the upper surface of lead frame 2a with a bonding layer 10 interposed therebetween. For example, bonding layer 10 is a conductive bonding layer obtained by curing a silver (Ag) paste. First semiconductor element 1 and third semiconductor element 3 are disposed at intervals on the upper surface of lead frame 2b. First semiconductor element 1 and third semiconductor element 3 are connected to the upper surface of lead frame 2b with solder 9 interposed therebetween.

Second wiring 7 is disposed so as to connect between first semiconductor element 1 and second semiconductor element 8 and between second semiconductor element 8 and lead frame 2a. First wiring 11 is disposed so as to connect between first semiconductor element 1 and third semiconductor element 3 and between third semiconductor element 3 and lead frame 2b.

First wiring 11 is connected to first semiconductor element 1 that is a power semiconductor element such as the IGBT, and is a wiring through which a large current flows. For this reason, as the material of first wiring 11, inexpensive aluminum (Al) is generally used although electric conductivity is not as high as silver (Ag). For example, a diameter D1 of first wiring 11 that is an aluminum wiring 16 is greater than or equal to 0.1 mm and less than or equal to 0.5 mm.

For example, a metal having relatively high electrical conductivity such as gold (Au), silver (Ag), or copper (Cu) is selected as the material of second wiring 7. For example, a diameter D2 of the second wiring 7 is less than or equal to 0.05 mm.

Molding resin 4 is formed so as to hold parts of lead frames 2a, 2b, first semiconductor element 1, second semiconductor element 8, third semiconductor element 3, first wiring 11, and second wiring 7 in molding resin 4. For example, molding resin 4 is made of a thermosetting epoxy resin. Molding resin 4 may contain a filler. For example, a filler made of silicon dioxide may be used as the filler. Such molding resin 4 can have a thermal expansion coefficient close to a thermal expansion coefficient of copper constituting lead frames 2a, 2b.

IC terminal 6 formed at the end of lead frame 2a protrudes to the outside of molding resin 4. Power terminal 5 formed at the end of lead frame 2b protrudes to the outside of molding resin 4. Power terminal 5 protrudes from a first side surface of molding resin 4. IC terminal 6 protrudes from a second side surface located on a side opposite to the first side surface in molding resin 4. Power terminal 5 is formed so as to extend in a direction (upward) intersecting with the upper surface of lead frame 2b to which first semiconductor element 1 is connected. IC terminal 6 is formed so as to extend in a direction (upward) intersecting with the upper surface of lead frame 2a to which second semiconductor element 8 is connected. As illustrated in FIG. 1, second semiconductor element 8 is disposed at a position different from a position of first semiconductor element 1 in a thickness direction from first main surface 1a to second main surface 1b, namely, in a direction indicated by an arrow 30 in FIG. 1.

For example, first semiconductor element 1 is an insulated gate bipolar transistor (IGBT). For example, first semiconductor element 1 may be a metal oxide semiconductor field effect transistor (MOSFET). For example, second semiconductor element 8 is an integrated circuit (IC) element. Third semiconductor element 3 may be a diode element, and for example, be a Schottky barrier diode (SBD). For example, a material constituting first semiconductor element 1 and third semiconductor element 3 may be silicon, and be another material such as silicon carbide.

As illustrated in FIG. 2, first semiconductor element 1 includes first main surface 1a and second main surface 1b. Second main surface 1b is located on the opposite side of first main surface 1a. An electrode 1c is formed on first main surface 1a. Second main surface 1b faces lead frame 2b. First wiring 11 is connected to electrode 1c. First wiring 11 includes an end 11a connected to electrode 1c. First wiring 11 is connected to electrode 1c by wedge bonding. Accordingly, end 11a includes an upper surface 11aa and a cut surface 11ab. Cut surface 11ab is a shear surface of first wiring 11 and is located in a direction different from upper surface 11aa. Cut surface 1 lab is a side end surface of end 11a of first wiring 11.

Second wiring 7 electrically connects first semiconductor element 1 and second semiconductor element 8. As illustrated in FIG. 2, diameter D2 of second wiring 7 is smaller than diameter D1 of the first wiring 11. Second wiring 7 includes a first end 7a and a second end 7b. Second end 7b is located on the opposite side of first end 7a. First end 7a is directly connected to upper surface 11aa of end 11a of first wiring 11. As illustrated in FIG. 1, second end 7b is connected to second semiconductor element 8.

As illustrated in FIG. 3, two first wirings 11 are connected to electrode 1c of first semiconductor element 1. The number of first wirings 11 connected to electrode 1c may be greater than or equal to 3. Second wiring 7 is connected to each of the plurality of first wirings 11 connected to electrode 1c.

Second wiring 7 is connected to first semiconductor element 1 and second semiconductor element 8 by ball bonding. At either one of first end 7a and second end 7b of second wiring 7, a planar shape of a part connected to upper surface 11aa or an electrode (not illustrated) of second semiconductor element 8 at end 11a of first wiring 11 is, for example, a circular shape or a semicircular shape. The planar shape of the part is at least partially curved. That is, one of first end 7a and second end 7b of second wiring 7 does not have the cut surface unlike end 11a of first wiring 11.

In the semiconductor device described above, power terminal 5 and IC terminal 6 that protrude from molding resin 4, and the region (die bond region) to which first semiconductor element 1, second semiconductor element 8, and third semiconductor element 3 are connected are constituted by the same lead frames 2a, 2b, and the die bond region may be constituted by an insulating substrate. For example, an insulating substrate having a stacked structure, in which a first metal layer is formed on the upper surface of the insulating layer and a second metal layer is formed on a lower surface of the insulating layer, may be used as the insulating substrate. The first metal layer and the second metal layer are electrically insulated by the insulating layer. In this case, first semiconductor element 1, second semiconductor element 8, or third semiconductor element 3 is mounted on the first metal layer. Power terminal 5 and IC terminal 6 may be connected to the first metal layer by the bonding material such as solder, or be directly connected to the first metal layer by ultrasonic bonding or the like. Alternatively, power terminal 5 and IC terminal 6 may be connected to the first metal layer through the connection wiring.

<Method for Manufacturing Semiconductor Device>

Figure 4:
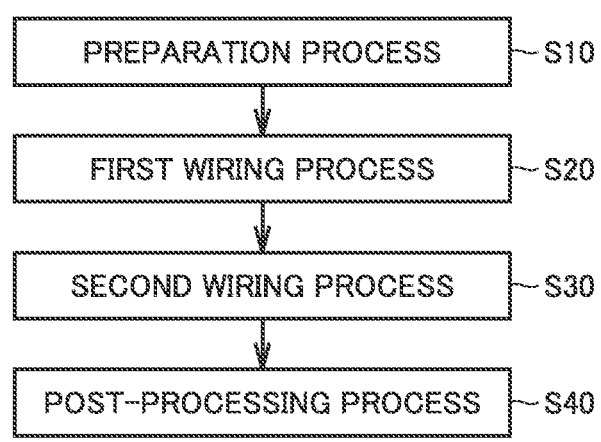
FIG. 4 is a flowchart illustrating a method for manufacturing the semiconductor device in FIG. 1.
Figure 5:
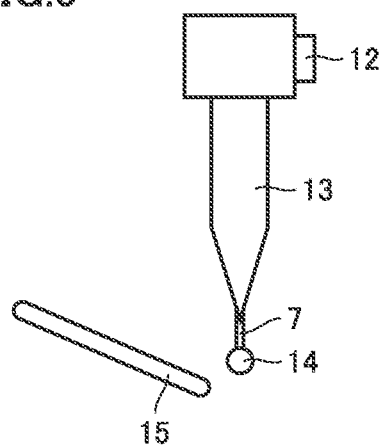
FIG. 5 is a schematic diagram illustrating the method of manufacturing the semiconductor device in FIG. 1.

FIG. 4 is a flowchart illustrating a method for manufacturing the semiconductor device in FIG. 1. FIG. 5 is a schematic diagram illustrating the method of manufacturing the semiconductor device in FIG. 1.

As illustrated in FIG. 4, in the method for manufacturing the semiconductor device, first a preparation process (S10) is performed. In the preparation process (S10), lead frames 2a, 2b, first semiconductor element 1, second semiconductor element 8, and third semiconductor element 3 are prepared. Furthermore, first semiconductor element 1, second semiconductor element 8, and third semiconductor element 3 are bonded to lead frames 2a, 2b. As illustrated in FIG. 2, first semiconductor element 1 includes first main surface 1a and second main surface 1b. Second main surface 1b is located on the opposite side of first main surface 1a. Electrode 1c is formed on first main surface 1a. Second semiconductor element 8 is bonded to lead frame 2a positioned above lead frame 2b to which first semiconductor element 1 is bonded. Specifically, a silver paste is disposed on the upper surface of lead frame 2a, and second semiconductor element 8 is mounted on the silver paste. The silver paste is cured by heating in an oven to form bonding layer 10 (see FIG. 1). Second semiconductor element 8 is bonded to lead frame 2a by bonding layer 10. First semiconductor element 1 and third semiconductor element 3 are bonded to lead frame 2b by solder 9 (see FIG. 1). Second semiconductor element 8 is disposed above first semiconductor element 1 at a position different from a position of first semiconductor element 1 in the thickness direction from first main surface 1a to second main surface 1b.

Subsequently, a first wiring process (S20) is performed. In this process, end 11a of first wiring 11 is connected to electrode 1c. Specifically, electrode 1c (see FIG. 2) of first semiconductor element 1 and the electrode of third semiconductor element 3 are connected by first wiring 11. The electrode of third semiconductor element 3 and a pad (not illustrated) formed on lead frame 2b are connected to each other by first wiring 11. First wiring 11 is connected by wedge bonding using an ultrasonic bonding device. In the wedge bonding, for example, an indentation pressed by a tool remains on upper surface 11aa at end 11a bonded to electrode 1c. Cut surface 11ab obtained by cutting first wiring 11 during the wedge bonding is formed at a side end of end 11a.

Subsequently, a second wiring process (S30) is performed. In the second wiring process (S30), first semiconductor element 1 and second semiconductor element 8 are electrically connected by second wiring 7. Second semiconductor element 8 and the pad of lead frame 2a are electrically connected to each other by second wiring 7. On electrode 1c of first semiconductor element 1, first end 7a of second wiring 7 is directly connected to upper surface 11aa of end 11a of first wiring 11. Second end 7b is connected to second semiconductor element 8. Second semiconductor element 8 and a pad (not illustrated) formed on lead frame 2a are connected to each other by second wiring 7. Second wiring 7 is connected by ball bonding.

Here, the ball bonding will be briefly described. In the ball bonding of second wiring 7, as illustrated in FIG. 5, second wiring 7 is held while the end of second wiring 7 protrudes from the tip of a capillary 13 attached to a tip of a horn 12 of the ultrasonic bonding device. Capillary 13 is a cylindrical bonding tool. Second wiring 7 is inserted into capillary 13 and partially protrudes from the tip of capillary 13 as described above. A spark rod 15 is disposed so as to face second wiring 7 protruding from the tip of capillary 13. By applying voltage to spark rod 15, an electric discharge is generated between spark rod 15 and the tip of second wiring 7. The electric discharge melt the tip of second wiring 7 to form a free air ball (FAB) 14. After FAB 14 is formed, FAB 14 of second wiring 7 is pressed against an electrode (not illustrated) formed on the upper surface of second semiconductor element 8 that is a bonding target by moving horn 12 and capillary 13. In this state, an ultrasonic wave is applied to second wiring 7 to bond FAB 14 of second wiring 7 to the electrode of second semiconductor element 8.

Thereafter, horn 12 and capillary 13 are moved while second wiring 7 is unwound from the tip of capillary 13 such that second wiring 7 forms a loop. After capillary 13 moves onto upper surface 11aa (see FIG. 2) of end 11a of first wiring 11, a part of second wiring 7 located at the tip of capillary 13 is pressed against upper surface 11aa (see FIG. 2) of end 11a of first wiring 11. Second wiring 7 is bonded to end 11a of first wiring 11 by applying the ultrasonic wave to second wiring 7 in this state. Thereafter, capillary 13 rises so as to be separated from end 11a of first wiring 11 while holding a part of second wiring 7. As a result, tensile stress is applied to a part of second wiring 7 located between capillary 13 and the part (fixing portion) of second wiring 7 bonded to end 11a of first wiring 11, and second wiring 7 breaks. In this way, first semiconductor element 1 and second semiconductor element 8 are electrically connected by second wiring 7. Second wiring 7 connected to first semiconductor element 1 is a source-side wiring.

As described above, diameter D1 is larger than diameter D2 of second wiring 7, and second wiring 7 having relatively small diameter D2 is connected to first wiring 11 (what is called a wedge bonded wiring) having cut surface 11ab at end 11a that is connected to electrode 1c by ball bonding. As described above, second wiring 7 is connected on end 11a of first wiring 11, so that a distance L1 between the surface of electrode 1c of first semiconductor element 1 and second wiring 7 can be sufficiently increased as illustrated in FIG. 2. In addition, second wiring 7 is not directly ball-bonded to the surface of electrode 1c of first semiconductor element 1, so that a possibility that first semiconductor element 1 is damaged by impact due to the bonding operation can be reduced.

A method for bonding second wiring 7 that connects second semiconductor element 8 and the pad of lead frame 2a is basically similar to the method described above. Specifically, after the FAB is formed at the tip of second wiring 7, FAB 14 of second wiring 7 is pressed against an electrode (not illustrated) formed on the upper surface of second semiconductor element 8 by moving horn 12 and capillary 13. In this state, an ultrasonic wave is applied to second wiring 7 to bond FAB 14 of second wiring 7 to the electrode of second semiconductor element 8. Subsequently, horn 12 and capillary 13 are moved while second wiring 7 is unwound from the tip of capillary 13 such that second wiring 7 forms a loop. After capillary 13 moves onto the pad of lead frame 2a, a part of second wiring 7 located at the tip of capillary 13 is pressed against the pad. Second wiring 7 is bonded to the pad of lead frame 2a by applying the ultrasonic wave to second wiring 7 in this state. Thereafter, capillary 13 rises so as to be separated from lead frame 2a while holding a part of second wiring 7. As a result, tensile stress is applied to a part of second wiring 7 located between the part (fixing portion) of second wiring 7 bonded to the pad of lead frame 2a and capillary 13, and second wiring 7 is broken. In this manner, second semiconductor element 8 and the pad of lead frame 2a are electrically connected to each other by second wiring 7.

Subsequently, a post-processing process (S40) is performed. In the post-processing process (S40), parts of the lead frames 2a, 2b, first semiconductor element 1, second semiconductor element 8, third semiconductor element 3, first wiring 11, and second wiring 7 are sealed with molding resin 4. For example, molding resin 4 is molded using a transfer molding device. In this way, the semiconductor device in FIGS. 1 to 3 is manufactured.

<Action and Effect>

The semiconductor device according to the present disclosure includes first semiconductor element 1, second semiconductor element 8, first wiring 11, and second wiring 7. First semiconductor element 1 includes first main surface 1a and second main surface 1b. Second main surface 1b is located on the opposite side of first main surface 1a. An electrode 1c is formed on first main surface 1a. Second semiconductor element 8 is disposed at the position different from the position of first semiconductor element 1 in the thickness direction from first main surface 1a to second main surface 1b. First wiring 11 is connected to electrode 1c. First wiring 11 includes an end 11a connected to electrode 1c. End 11a includes upper surface 11aa and cut surface 11ab. Cut surface 11ab is located in the direction different from upper surface 11aa. Second wiring 7 electrically connects first semiconductor element 1 and second semiconductor element 8. Diameter D2 of second wiring 7 is smaller than diameter D1 of first wiring. Second wiring 7 includes a first end 7a and a second end 7b. Second end 7b is located on the opposite side of first end 7a. First end 7a is directly connected to upper surface 11aa of end 11a of first wiring 11. Second end 7b is connected to second semiconductor element 8.

In this case, second wiring 7 is connected to upper surface 11aa of end 11a of first wiring 11, so that distance L1 between second wiring 7 and first semiconductor element 1 can be sufficiently secured by first wiring 11. In addition, because end 11a that is the base of second wiring 7 is connected onto electrode 1c, the base is formed on first semiconductor element 1 as in the case where the multistage bump is formed as the base like the conventional case, so that impact due to a plurality of times of bonding is not applied. Thus, the possibility that first semiconductor element 1 is damaged due to the impact can be reduced.

For example, when first semiconductor element 1 and second semiconductor element 8 that are disposed at different positions in the thickness direction of first semiconductor element 1 are connected by second wiring 7 to be ball-bonded, a head part such as capillary 13 (see FIG. 5) of the ultrasonic bonding device used for the ball bonding is inclined at different angles on first semiconductor element 1 and second semiconductor element 8. When the inclination of the head part is different as described above, the stress applied to second wiring 7 during the bonding changes as compared with the normal time (when the head part is substantially perpendicular to first semiconductor element 1 and the like). For this reason, it is conceivable that the stress different from the normal stress is applied to first semiconductor element 1 during the bonding to damage first semiconductor element 1. However, in the above-described semiconductor device, second wiring 7 is connected to end 11a of first wiring 11 but is not in direct contact with first semiconductor element 1. Accordingly, the generation of the above problem can be prevented.

The method for manufacturing the semiconductor device of the present disclosure includes the process (S10) of preparing first semiconductor element 1 and second semiconductor element 8. First semiconductor element 1 includes first main surface 1a and second main surface 1b. Second main surface 1b is located on the opposite side of first main surface 1a. Electrode 1c is formed on first main surface 1a. Second semiconductor element 8 is disposed at the position different from the position of first semiconductor element 1 in the thickness direction from first main surface 1a to second main surface 1b. The method for manufacturing the semiconductor device further includes the process (S20) of connecting end 11a of first wiring 11 to electrode 1c, and the process (S30) of electrically connecting first semiconductor element 1 and second semiconductor element 8 by second wiring 7. End 11a includes upper surface 11aa and cut surface 11ab. Cut surface 11ab is located in the direction different from upper surface 11aa. Diameter D2 of second wiring 7 is smaller than diameter D1 of first wiring 11. Second wiring 7 includes a first end 7a and a second end 7b. Second end 7b is located on the opposite side of first end 7a. In the process (S30) of electrically connecting by second wiring 7, first end 7a is directly connected to upper surface 11aa of end 11a of first wiring 11. Second end 7b is connected to second semiconductor element 8.

In this way, semiconductor device in FIGS. 1 to 3 can be obtained.

In the method for manufacturing the semiconductor device, end 11a may be connected to electrode 1c by wedge bonding in the process (S20) of connecting end 11a of first wiring 11. In the process (S30) of electrically connecting by second wiring 7, second wiring 7 may be connected to first semiconductor element 1 and second semiconductor element 8 by the ball bonding.

In this case, because upper surface 11aa of end 11a of the first wiring is pressed by the processing tool during the wedge bonding, the upper surface 11aa becomes a relatively flat surface suitable for joining first end 7a of second wiring 7. Consequently, first end 7a of second wiring 7 can be easily bonded to end 11a of first wiring 11.

Second Embodiment

<Configuration of Semiconductor Device>

Figure 6:
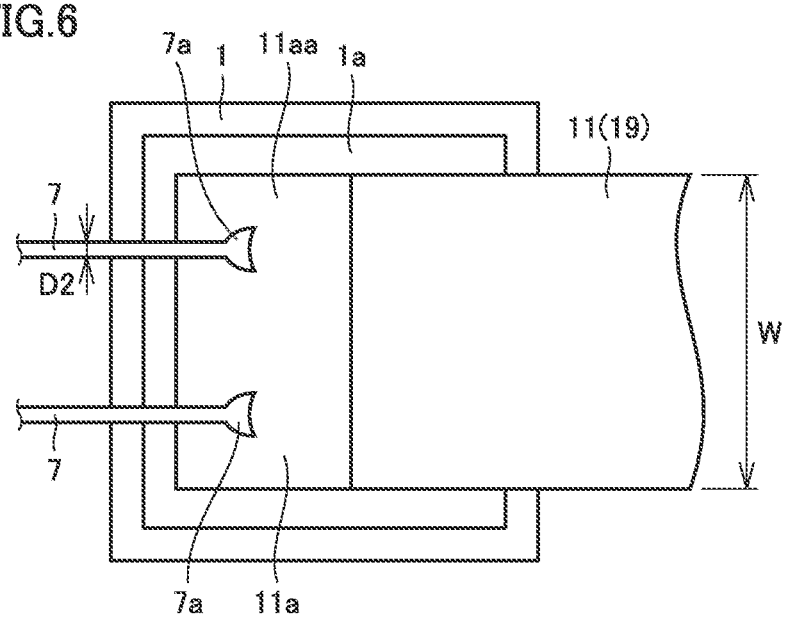
FIG. 6 is a sectional partially plan view illustrating a semiconductor device according to a second embodiment.

FIG. 6 is a sectional partially plan view illustrating a semiconductor device according to a second embodiment. The semiconductor device in FIG. 6 basically has the same configuration as that of the semiconductor device in FIGS. 1 to 3 and can obtain the same effect, but is different from the semiconductor device in FIGS. 1 to 3 in that first wiring 11 is a ribbon wire 19 having a ribbon shape.

Ribbon wire 19 includes end 11a connected to electrode 1c. Ribbon wire 19 has a rectangular sectional shape in the width direction intersecting with the extending direction. End 11a includes upper surface 11aa. Second wiring 7 electrically connects first semiconductor element 1 and second semiconductor element 8 (see FIG. 1). Diameter D2 of second wiring 7 is smaller than width W of ribbon wire 19 in the direction intersecting with the extending direction of ribbon wire 19 that is first wiring 11. Second wiring 7 includes first end 7a and second end 7b (see FIG. 1). Second end 7b is located on the opposite side of first end 7a. Second end 7b is connected to second semiconductor element 8 as illustrated in FIG. 1. First end 7a is directly connected to upper surface 11aa of end 11a of first wiring 11.

For example, aluminum can be used as a material of ribbon wire 19. In this case, when second wiring 7 is bonded to ribbon wire 19, the impact (for example, the impact when ultrasonic bonding is performed) generated during the bonding can be absorbed to some extent by ribbon wire 19. Consequently, the possibility that first semiconductor element 1 is damaged by the impact can be reduced.

<Method for Manufacturing Semiconductor Device>

The method for manufacturing the semiconductor device in FIG. 6 has a configuration basically similar to that of the method for manufacturing the semiconductor device in FIG. 4, but the content of first wiring process (S20) in FIG. 4 is partially different from that in FIG. 6. In the process (S20), end 11a of ribbon wire 19 that is first wiring 11 is connected to electrode 1c. Specifically, electrode 1c (see FIG. 2) of first semiconductor element 1 and the electrode of third semiconductor element 3 are connected to each other by ribbon wire 19. Furthermore, the electrode of third semiconductor element 3 and a pad (not illustrated) formed on lead frame 2b are connected to each other by ribbon wire 19 or a normal conductive wire. Ribbon wire 19 is connected by the wedge bonding using the ultrasonic bonding device. In the wedge bonding, for example, an indentation pressed by a tool remains on upper surface 11aa at end 11a bonded to electrode 1c.

The processes (S10), (S30), (S40) other than the above process (S20) are similar to those in the method for manufacturing the semiconductor device in FIG. 4.

<Modification>

Figure 7:
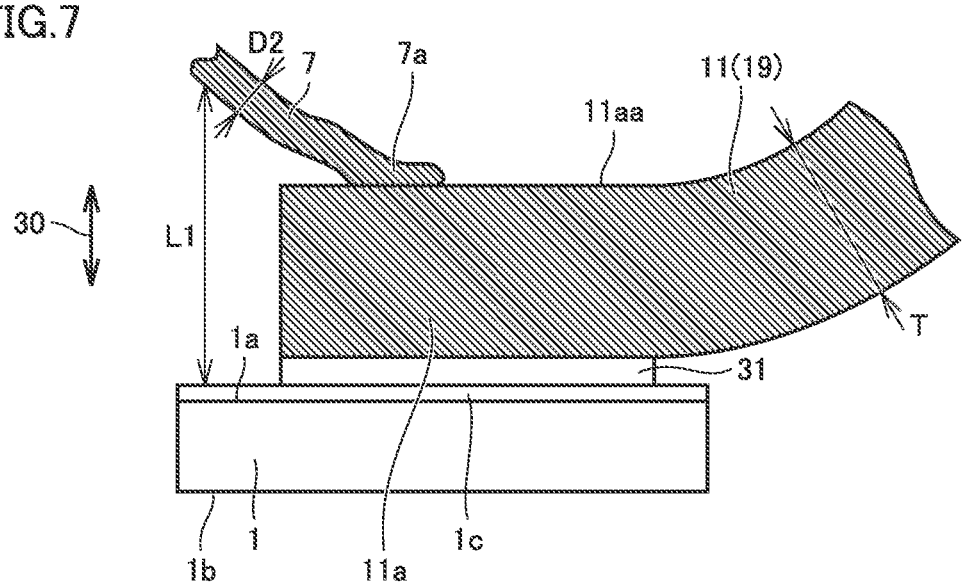
FIG. 7 is a schematic partially sectional view illustrating a modification of the semiconductor device in FIG. 6.

FIG. 7 is a schematic partially sectional view illustrating a modification of the semiconductor device in FIG. 6. The semiconductor device in FIG. 7 basically has the same configuration as that of the semiconductor device in FIG. 6, and can obtain the same effects, but the configuration of the joint portion between ribbon wire 19 that is first wiring 11 and electrode 1c is different from that of the semiconductor device in FIG. 6. In the semiconductor device in FIG. 7, ribbon wire 19 is bonded to electrode 1c with solder 31 interposed therebetween. The thickness of solder 31 is smaller than thickness T of ribbon wire 19 that is first wiring 11.

<Action and Effect>

As illustrated in FIGS. 1, 6, and 7, the semiconductor device of the present disclosure includes first semiconductor element 1, second semiconductor element 8, ribbon wire 19 that is first wiring 11, and second wiring 7. First semiconductor element 1 includes first main surface 1a and second main surface 1b. Second main surface 1b is located on the opposite side of first main surface 1a. An electrode 1c is formed on first main surface 1a. Second semiconductor element 8 is disposed at the position different from the position of first semiconductor element 1 in the thickness direction from first main surface 1a to second main surface 1b. Ribbon wire 19 that is first wiring 11 is connected to electrode 1c. Ribbon wire 19 that is first wiring 11 has a ribbon shape and includes end 11a connected to electrode 1c. End 11a includes upper surface 11aa. Second wiring 7 electrically connects first semiconductor element 1 and second semiconductor element 8. Diameter D2 of second wiring 7 is smaller than width W of first wiring 11 in the direction intersecting with extending direction of first wiring 11. Diameter D2 of second wiring 7 is smaller than thickness T of ribbon wire 19 that is first wiring 11. Second wiring 7 includes a first end 7a and a second end 7b. Second end 7b is located on the opposite side of first end 7a. First end 7a is directly connected to upper surface 11aa of end 11a of ribbon wire 19 that is first wiring 11. Second end 7b is connected to second semiconductor element 8.

In this case, second wiring 7 is connected to upper surface 11aa of end 11a of ribbon wire 19 that is the ribbon-shaped first wiring 11, so that distance L1 between second wiring 7 and first semiconductor element 1 can be sufficiently secured by ribbon wire 19. In addition, because end 11a that is the base of second wiring 7 is connected onto electrode 1c, the base is formed on first semiconductor element 1 as in the case where the multistage bump is formed as the base like the conventional case, so that impact due to a plurality of times of bonding is not applied. Thus, the possibility that first semiconductor element 1 is damaged due to the impact can be reduced.

In addition, ribbon wire 19 is used as first wiring 11, so that the area of upper surface 11aa of end 11a can be made larger than that in the case where first wiring 11 is a linear wiring. Therefore, the degree of freedom in selecting the connection position of second wiring 7 with respect to upper surface 11aa can be increased. In addition, the plurality of second wirings 7 can be easily connected to end 11a.

The method for manufacturing the semiconductor device of the present disclosure includes the process (S10) of preparing first semiconductor element 1 and second semiconductor element 8. First semiconductor element 1 includes first main surface 1a and second main surface 1b. Second main surface 1b is located on the opposite side of first main surface 1a. Electrode 1c is formed on first main surface 1a. Second semiconductor element 8 is disposed at the position different from the position of first semiconductor element 1 in the thickness direction from first main surface 1a to second main surface 1b. The method for manufacturing the semiconductor device further includes the process (S20) of connecting end 11a of ribbon wire 19 that is first wiring 11 to electrode 1c, and the process (S30) of electrically connecting first semiconductor element 1 and second semiconductor element 8 to each other by second wiring 7. First wiring 11 is ribbon wire 19 having a ribbon shape. End 11a includes upper surface 11aa. Diameter D2 of second wiring 7 is smaller than width W of ribbon wire 19 in the direction intersecting with the extending direction of ribbon wire 19 that is first wiring 11. Second wiring 7 includes a first end 7a and a second end 7b. Second end 7b is located on the opposite side of first end 7a. In the process (S30) of electrically connecting by second wiring 7, first end 7a is directly connected to upper surface 11aa of end 11a of ribbon wire 19 that is first wiring 11. Second end 7b is connected to second semiconductor element 8.

In this way, the semiconductor device in FIG. 6 can be obtained.

Third Embodiment

<Configuration of Semiconductor Device>

Figure 8:
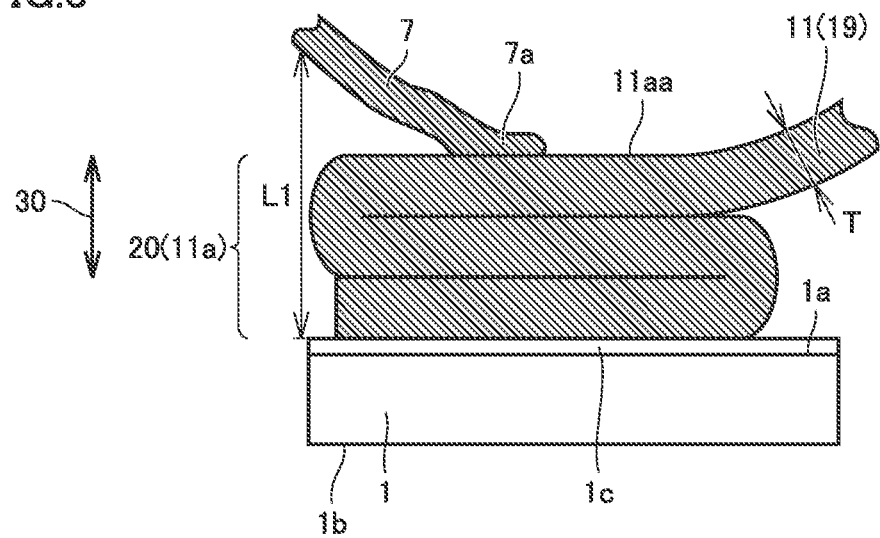
FIG. 8 is a schematic partially sectional view illustrating a semiconductor device according to a third embodiment.

FIG. 8 is a schematic partially sectional view illustrating a semiconductor device according to a third embodiment. The semiconductor device in FIG. 8 basically has the same configuration as that of the semiconductor device in FIG. 6, and can obtain the same effects, but the configuration of the joint portion between ribbon wire 19 that is first wiring 11 and electrode 1c is different from that of the semiconductor device in FIG. 6. Specifically, in the semiconductor device in FIG. 8, first wiring 11 is bent and stacked at end 11a of ribbon wire 19 that is first wiring 11. In FIG. 8, ribbon wire 19 is bent twice at end 11a to form a stacked structure 20 having three stacked layers. In end 11a, upper surface 11aa is a top surface of stacked ribbon wires 19. First end 7a of second wiring 7 is connected to the top surface of stacked ribbon wires 19. The direction in which ribbon wire 19 extends from end 11a and the direction in which second wiring 7 extends away from upper surface 11aa of end 11a are opposite to each other in the horizontal direction.

<Method for Manufacturing Semiconductor Device>

The method for manufacturing the semiconductor device in FIG. 8 has a configuration basically similar to that of the method for manufacturing the semiconductor device in FIG. 6, but the content of first wiring process (S20) in FIG. 4 is partially different from that in FIG. 8. In the process (S20), ribbon wire 19 that is first wiring 11 is bent and stacked on electrode 1c. Specifically, the tip of ribbon wire 19 that is first wiring 11 is connected to electrode 1c, and the tip of ribbon wire 19 is bent to form stacked structure 20. In the process (S20), electrode 1c (see FIG. 2) of first semiconductor element 1 and the electrode of third semiconductor element 3 are connected to each other by ribbon wire 19. Furthermore, the electrode of third semiconductor element 3 and a pad (not illustrated) formed on lead frame 2b are connected to each other by ribbon wire 19 or a normal conductive wire. Ribbon wire 19 is connected by the wedge bonding using the ultrasonic bonding device. When ribbon wire 19 is connected to electrode 1c of first semiconductor element 1, as illustrated in FIG. 8, first the tip of ribbon wire 19 is bonded to electrode 1c by the wedge bonding. Thereafter, ribbon wire 19 is pressed on the tip while being bent a plurality of times by operating the bonding tool. As a result, as illustrated in FIG. 8, end 11a that is stacked structure 20 in which ribbon wire 19 is folded and stacked a plurality of times is obtained.

The processes (S10), (S30), (S40) other than the above process (S20) are similar to those in the method for manufacturing the semiconductor device in FIG. 4.

<Action and Effect>

In the semiconductor device, ribbon wire 19 that is first wiring 11 may be bent and stacked at end 11a of ribbon wire 19 that is first wiring 11. In end 11a, upper surface 11aa may be the top surface of ribbon wire 19 that is stacked first wiring 11. In this case, even when thickness T of the first wiring is not sufficiently thick, the height from electrode 1c to upper surface 11aa of end 11a (the height of end 11a) can be sufficiently increased by bending and stacking ribbon wire 19 at end 11a. Consequently, similarly to the semiconductor device in FIGS. 1 to 3, distance L1 between second wiring 7 and first semiconductor element 1 can be sufficiently increased. Because the height of end 11a can be controlled by changing the number of stacked ribbon wires 19, special ribbon wire 19 having large thickness T is not required to be used as first wiring 11, and general ribbon wire 19 can be used. Consequently, the increase in manufacturing cost of the semiconductor device can be prevented.

In the method for manufacturing the semiconductor device, first wiring 11 may be bent and stacked on electrode 1c at end 11a of first wiring 11 in the process (S20) of connecting end 11a of first wiring 11. In the process (S30) of electrically connecting by second wiring 7, upper surface 11aa may be the top surface of stacked first wiring 11 at end 11a.

In this case, the semiconductor device in FIG. 8 can be obtained.

Fourth Embodiment

<Configuration of Semiconductor Device>

Figure 9:
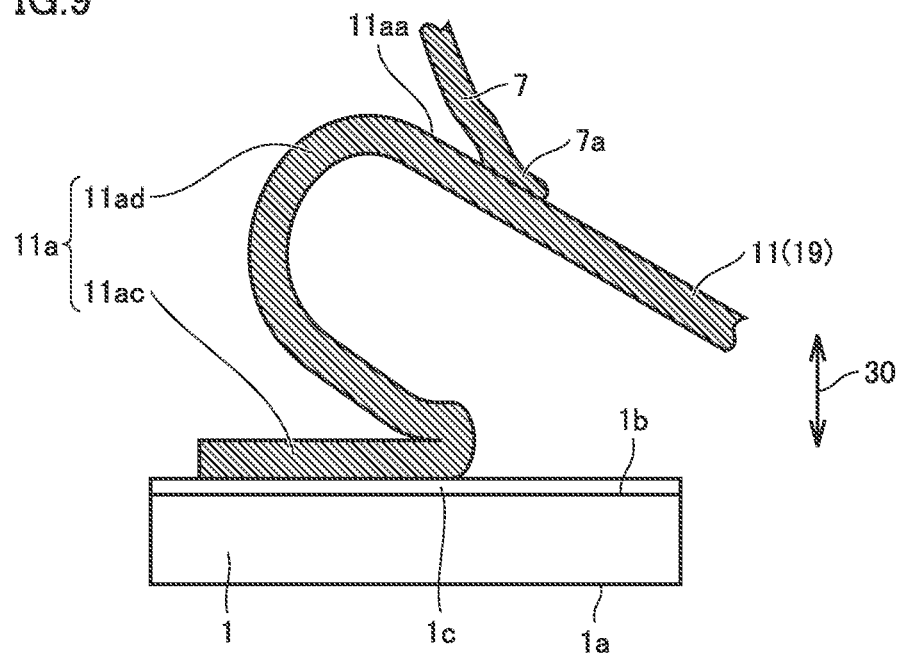
FIG. 9 is a schematic partially sectional view illustrating a semiconductor device according to a fourth embodiment.

FIG. 9 is a schematic partially sectional view illustrating a semiconductor device according to a fourth embodiment. The semiconductor device in FIG. 9 basically has the same configuration as that of the semiconductor device in FIG. 6, and can obtain the same effects, but the configuration of the joint portion between ribbon wire 19 that is first wiring 11 and electrode 1c is different from that of the semiconductor device in FIG. 6. Specifically, in the semiconductor device of FIG. 9, end 11a of ribbon wire 19 that is first wiring 11 includes a fixing portion 11ac and a loop portion 11ad. Fixing portion 11ac is directly connected to electrode 1c. Loop portion 11ad is continuous with fixing portion 11ac and becomes protrusion on the side of the direction (direction toward second semiconductor element 8 or upward) away from electrode 1c in the thickness direction of fixing portion 11ac from electrode 1c. The end of loop portion 11ad opposite to the side continuous with fixing portion 11*ac* extends onto third semiconductor element 3 (see FIG. 1) in ribbon wire 19. In end 11*a*, upper surface 11*aa* is the upper surface of loop portion 11*ad*. Second wiring 7 is connected to upper surface 11*aa* of loop portion 11*ad*.

A part of loop portion 11*ad* is located on fixing portion 11*ac*. In plan view seen from the direction perpendicular to the surface of electrode 1*c*, a part of loop portion 11*ad* overlaps with fixing portion 11*ac*. First end 7*a* of second wiring 7 may be connected to loop portion 11*ad* at the position overlapping with fixing portion 11*ac* in plan view. Alternatively, first end 7*a* of second wiring 7 may be connected to loop portion 11*ad* at the position not overlapping with fixing portion 11*ac* in plan view. The direction in which ribbon wire 19 extends from end 11*a* and the direction in which second wiring 7 extends away from upper surface 11*aa* of end 11*a* are opposite to each other in the horizontal direction.

<Method for Manufacturing Semiconductor Device>

The method for manufacturing the semiconductor device in FIG. 9 has a configuration basically similar to that of the method for manufacturing the semiconductor device in FIG. 6, but the content of first wiring process (S20) in FIG. 4 is partially different from that in FIG. 9. In the process (S20), when ribbon wire 19 is connected to electrode 1*c* of first semiconductor element 1, end 11*a* including fixing portion 11*ac* and loop portion 11*ad* is formed by ribbon wire 19 that is first wiring 11. Specifically, as illustrated in FIG. 9, the tip of ribbon wire 19 is bonded to electrode 1*c* by the wedge bonding to form fixing portion 11*ac*. Thereafter, ribbon wire 19 is bent such that ribbon wire 19 forms loop portion 11*ad* on fixing portion 11*ac* by operating the bonding tool. As a result, as illustrated in FIG. 9, fixing portion 11*ac* directly connected to electrode 1*c* and loop portion 11*ad* that is continuous with fixing portion 11*ac* and becomes protrusion on the side of second semiconductor element 8 from electrode 1*c* in the thickness direction of ribbon wire 19 are formed at end 11*a* of ribbon wire 19.

The processes (S10), (S30), (S40) other than the above process (S20) are similar to those in the method for manufacturing the semiconductor device in FIG. 4. In the process (S30), at end 11*a*, second wiring 7 is connected to the upper surface of loop portion 11*ad* that is upper surface 11*aa*.

<Action and Effect>

In the semiconductor device, end 11*a* of ribbon wire 19 that is first wiring 11 includes fixing portion 11*ac* and loop portion 11*ad*. Fixing portion 11*ac* is directly connected to electrode 1*c*. Loop portion 11*ad* is continuous with fixing portion 11*ac* and becomes protrusion on the side of second semiconductor element 8 from electrode 1*c* in the thickness direction. In end 11*a*, upper surface 11*aa* may be the upper surface of loop portion 11*ad*.

In this case, in loop portion 11*ad* to which first end 7*a* of second wiring 7 is connected, a space is formed under the region to which first end 7*a* is connected. Therefore, when first end 7*a* of second wiring 7 is connected to ribbon wire 19, even when a tool (capillary or the like) connecting second wiring 7 comes into contact with end 11*a* of ribbon wire 19, loop portion 11*ad* can be easily displaced, so that application of excessive force to the tool can be prevented. Therefore, the possibility that the tool is damaged or the defect is generated in the process of connecting to end 11*a* of second wiring 7 can be reduced.

In the method for manufacturing the semiconductor device, in the process (S20) of connecting end 11*a* of first wiring 11, fixing portion 11*ac* that is directly connected to electrode 1*c* and loop portion 11*ad* connected to fixing portion 11*ac* and becomes protrusion on the side of second semiconductor element 8 from electrode 1*c* in the thickness direction may be formed at end 11*a* of first wiring 11. In the process (S30) of electrically connecting by second wiring 7, upper surface 11*aa* may be the upper surface of loop portion 11*ad* at end 11*a*.

In this case, the semiconductor device in FIG. 9 can be obtained.

Fifth Embodiment

<Configuration of Semiconductor Device>

Figure 10:
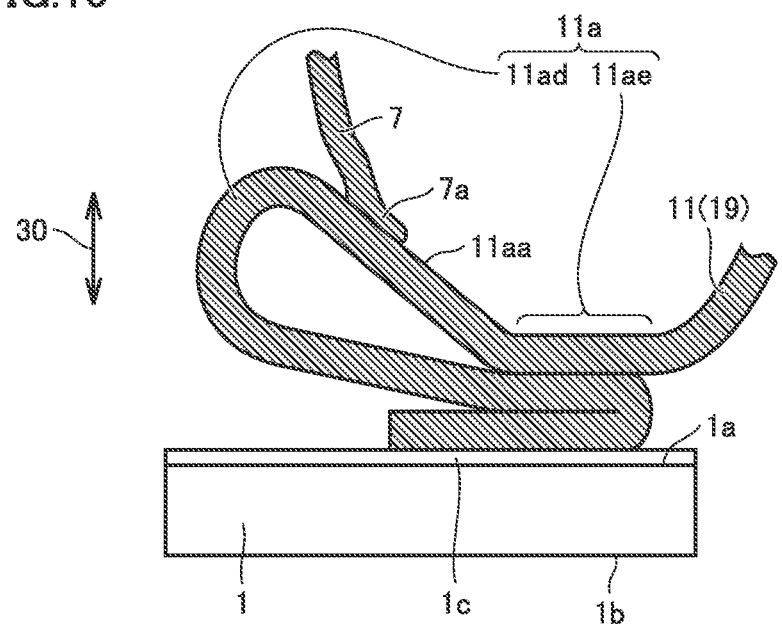
FIG. 10 is a schematic partially sectional view illustrating a semiconductor device according to a fifth embodiment.

FIG. 10 is a schematic partially sectional view illustrating a semiconductor device according to a fifth embodiment. The semiconductor device in FIG. 10 basically has the same configuration as that of the semiconductor device in FIG. 8, and can obtain the same effects, but the configuration of the joint portion between ribbon wire 19 that is first wiring 11 and electrode 1*c* is different from that of the semiconductor device in FIG. 8. Specifically, in the semiconductor device of FIG. 10, end 11*a* of ribbon wire 19 that is first wiring 11 includes closed loop shaped loop portion 11*ad* and a stacked fixing portion 11*ae*. Stacked fixing portion 11*ae* is a stacked structure portion including a lowermost layer directly connected to electrode 1*c* and an upper layer stacked on the lowermost layer. Loop portion 11*ad* is continuous with stacked fixing portion 11*ae* and becomes protrusion on the side of the direction (direction toward the second semiconductor element 8 or upward) away from electrode 1*c* in the thickness direction of stacked fixing portion 11*ae* from the electrode 1*c*. Both ends of loop portion 11*ad* are continuous with the upper layer stacked on stacked fixing portion 11*ae*. For this reason, loop portion 11*ad* is a closed loop. A part of loop portion 11*ad* is located outside stacked fixing portion 11*ae* in plan view. In end 11*a*, upper surface 11*aa* is the upper surface of loop portion 11*ad*. Second wiring 7 is connected to upper surface 11*aa* of loop portion 11*ad*.

A part of loop portion 11*ad* is located on the lowermost layer of the stacked structure. In plan view viewed from the direction perpendicular to the surface of electrode 1*c*, a part of loop portion 11*ad* overlaps with the lowermost layer. First end 7*a* of second wiring 7 may be connected to loop portion 11*ad* at the position overlapping with the lowermost layer in plan view. Alternatively, first end 7*a* of second wiring 7 may be connected to loop portion 11*ad* at the position not overlapping with the lowermost layer in plan view. The direction in which ribbon wire 19 extends from end 11*a* and the direction in which second wiring 7 extends away from upper surface 11*aa* of end 11*a* are opposite to each other in the horizontal direction.

<Method for Manufacturing Semiconductor Device>

The method for manufacturing the semiconductor device in FIG. 10 has a configuration basically similar to that of the method for manufacturing the semiconductor device in FIG. 8, but the content of the first wiring process (S20) illustrated in FIG. 4 is partially different from that in FIG. 10. In the process (S20), at end 11*a* of ribbon wire 19 that is first wiring 11, ribbon wire 19 is bent and stacked, and ribbon wire 19 forms closed loop shaped loop portion 11*ad*. Specifically, as illustrated in FIG. 10, the tip of ribbon wire 19 is bonded to electrode 1*c* by the wedge bonding to form the lowermost layer of stacked fixing portion 11*ae*. Thereafter, ribbon wire 19 is bent such that ribbon wire 19 forms loop portion 11*ad* on the lowermost layer by operating the bonding tool. Thereafter, stacked ribbon wire 19 is pressed so as to form stacked fixing portion 11*ae*. As a result, as illustrated in FIG. 10, stacked fixing portion 11*ae* including the lowermost layer directly connected to electrode 1c and closed loop portion 11ad that is continuous with stacked fixing portion 11ae and becomes protrusion on the side of second semiconductor element 8 from electrode 1c in the thickness direction of ribbon wire 19 are formed at end 11a of ribbon wire 19.

The processes (S10), (S30), (S40) other than the above process (S20) are similar to those in the method for manufacturing the semiconductor device in FIG. 4. In the process (S30), at end 11a, second wiring 7 is connected to the upper surface of loop portion 11ad that is upper surface 11aa.

<Action and Effect>

In the semiconductor device, at the end 11a of the ribbon wire 19 that is first wiring 11, ribbon wire 19 may be bent and stacked, and closed loop shaped loop portion 11ad may be formed by ribbon wire 19. In end 11a, upper surface 11aa may be the upper surface of loop portion 11ad.

In the method for manufacturing the semiconductor device, in the process (S20) of connecting ends 11a of first wirings 11, at end 11a of ribbon wire 19 that is first wiring 11, ribbon wire 19 that is first wiring 11 may be bent and stacked and ribbon wire 19 may form closed loop shaped loop portion 11ad. In the process (S30) of electrically connecting by second wiring 7, upper surface 11aa may be the upper surface of loop portion 11ad at end 11a.

In this case, in loop portion 11ad to which first end 7a of second wiring 7 is connected, a space is formed under the region to which first end 7a is connected. Therefore, when first end 7a of second wiring 7 is connected to ribbon wire 19 that is first wiring 11, even when the tool (capillary or the like) connecting second wiring 7 comes into contact with end 11a of ribbon wire 19, loop portion 11ad can be easily displaced, so that the application of the excessive force to the tool can be prevented. Therefore, the possibility that the tool is damaged or the defect is generated in the process of connecting to end 11a of second wiring 7 can be reduced.

In addition, loop portion 11ad has a closed loop shape, so that shape maintaining performance of loop portion 11ad can be improved. Therefore, even when loop portion 11ad is displaced to some extent, loop portion 11ad can return to the original shape. Therefore, the distance between first semiconductor element 1 and second wiring 7 can be sufficiently maintained.

While the embodiments of the present disclosure have been described, it should be understood that the embodiments disclosed herein are illustrative and non-restrictive in every respect. The scope of the present disclosure is defined by the terms of the claims, and is intended to include any modifications within the meaning and scope equivalent to the terms of the claims.

What is claimed is:

1. A semiconductor device comprising:
   a first semiconductor element including a first main surface and a second main surface located on a side opposite to the first main surface, an electrode being formed on the first main surface;
   a second semiconductor element disposed at a position different from a position of the first semiconductor element in a thickness direction from the first main surface toward the second main surface;
   a first wiring connected to the electrode; and
   a second wiring to electrically connect the first semiconductor element and the second semiconductor element,
   wherein the first wiring includes an end connected to the electrode,
   the end includes an upper surface and a cut surface located in a direction different from the upper surface,
   a diameter of the second wiring is smaller than a diameter of the first wiring,
   the second wiring includes a first end and a second end located on a side opposite to the first end,
   the first end is directly connected to the upper surface of the end of the first wiring, and
   the second end is connected to the second semiconductor element.

2. A semiconductor device comprising:
   a first semiconductor element including a first main surface and a second main surface located on a side opposite to the first main surface, an electrode being formed on the first main surface;
   a second semiconductor element disposed at a position different from a position of the first semiconductor element in a thickness direction from the first main surface toward the second main surface;
   a first wiring connected to the electrode; and
   a second wiring to electrically connect the first semiconductor element and the second semiconductor element,
   wherein the first wiring has a ribbon shape and includes an end connected to the electrode,
   the end includes an upper surface,
   a diameter of the second wiring is smaller than a width of the first wiring in a direction intersecting with an extending direction of the first wiring,
   the second wiring includes a first end and a second end located on a side opposite to the first end,
   the first end is directly connected to the upper surface of the end of the first wiring, and
   the second end is connected to the second semiconductor element.

3. The semiconductor device according to claim 2, wherein the first wiring is bent and stacked at the end of the first wiring, and
   the upper surface is a top surface of the first wiring stacked at the end.

4. The semiconductor device according to claim 2, wherein the end of the first wiring includes a fixing portion directly connected to the electrode and a loop portion that is continuous with the fixing portion and becomes protrusion on a side of the second semiconductor element from the electrode in the thickness direction, and
   the upper surface is an upper surface of the loop portion at the end.

5. The semiconductor device according to claim 2, wherein at the end of the first wiring, the first wiring is bent and stacked, and a loop portion is formed by the first wiring, the loop portion having a closed loop shape and
   the upper surface is an upper surface of the loop portion at the end.

6. A method for manufacturing a semiconductor device, the method comprising:
   preparing a first semiconductor element and a second semiconductor element, the first semiconductor element including a first main surface and a second main surface located on a side opposite to the first main surface, an electrode being formed on the first main surface, the second semiconductor element being disposed at a position different from a position of the first semiconductor element in a thickness direction from the first main surface toward the second main surface;
   connecting an end of a first wiring to the electrode; and
   electrically connecting the first semiconductor element and the second semiconductor element by a second wiring,
   wherein the first wiring has a ribbon shape, the end includes an upper surface, a diameter of the second wiring is smaller than a width of the first wiring in a direction intersecting with an extending direction of the first wiring, the second wiring includes a first end and a second end located on a side opposite to the first end, and in the electrically connecting the first semiconductor element and the second semiconductor element by the second wiring, the first end is directly connected to the upper surface of the end of the first wiring, and the second end is connected to the second semiconductor element.

7. The method according to claim 6, wherein in the connecting the end of the first wiring to the electrode, the first wiring is bent and stacked on the electrode at the end of the first wiring, and in the electrically connecting the first semiconductor element and the second semiconductor element by the second wiring, the upper surface is a top surface of the first wiring stacked at the end.

8. The method according to claim 6, wherein in the connecting the end of the first wiring to the electrode, a fixing portion directly connected to the electrode and a loop portion that is continuous with the fixing portion and becomes protrusion on a side of the second semiconductor element from the electrode in the thickness direction are formed at the end of the first wiring, and in the electrically connecting the first semiconductor element and the second semiconductor element by the second wiring, the upper surface is an upper surface of the loop portion at the end.

9. The method according to claim 6, wherein in the connecting the end of the first wiring to the electrode, at the end of the first wiring, the first wiring is bent and stacked, and a loop portion is formed by the first wiring, the loop portion having a closed loop shape and in the electrically connecting the first semiconductor element and the second semiconductor element by the second wiring, the upper surface is an upper surface of the loop portion at the end.

10. The method according to claim 6, wherein in the connecting the end of the first wiring to the electrode, the end is connected to the electrode by wedge bonding, and in the electrically connecting the first semiconductor element and the second semiconductor element by the second wiring, the second wiring is connected to the first semiconductor element and the second semiconductor element by ball bonding.

* * * * *